United States Patent [19]
Denjean et al.

[11] Patent Number: 5,500,644
[45] Date of Patent: Mar. 19, 1996

[54] PROCEDURE AND DEVICE FOR SELF-CALIBRATING ANALOG-TO-DIGITAL CONVERSION

[75] Inventors: Jean Denjean, Leognan; Jean-Pierre Mann, Gradignan, both of France

[73] Assignee: Thomson-CSF, Paris, France

[21] Appl. No.: 145,545

[22] Filed: Nov. 4, 1993

[30] Foreign Application Priority Data

Nov. 6, 1992 [FR] France ................................ 92 13398

[51] Int. Cl.⁶ ............................................ H03M 1/10
[52] U.S. Cl. ............................................ 341/120; 341/155
[58] Field of Search ............................ 341/120, 118, 341/121, 156, 161

[56] References Cited

U.S. PATENT DOCUMENTS

| | | | |
|---|---|---|---|
| 4,342,983 | 8/1982 | Weigand et al. | 341/120 |
| 4,947,168 | 8/1990 | Myers | 341/120 |
| 5,047,772 | 9/1991 | Ribner. | |

FOREIGN PATENT DOCUMENTS 2912925 10/1980 Germany.
WO 89/11757 11/1989 WIPO.

*Primary Examiner*—Brian K. Young
*Attorney, Agent, or Firm*—Pollock, Vande Sande & Priddy

[57] ABSTRACT

The invention concerns rapid, precise analog-to-digital converters (ADC). To achieve rapid conversion, the invention uses a fast though imprecise ADC, whose numeric output value is used to address a memory location in a first memory block containing correction values. Calibration measurements are inserted between conversion measurements, the time intervals being sufficient to establish a stable reference voltage at the output of a generator. The switching between conversion and calibration measurements is made using a switch. During calibration, the differences between the conversion results and the real values are written into a second memory block at addresses corresponding to the numeric output values of the ADC. Means of control and calculation enable sequencing and switching of the roles of the calibration and correction memory blocks at the end of a calibration.

13 Claims, 5 Drawing Sheets

PROCEDURE AND DEVICE FOR SELF-CALIBRATING ANALOG-TO-DIGITAL CONVERSION

BACKGROUND OF THE INVENTION

The invention concerns analog-to-digital converters (ADC).

Such converters are known to professionals and exist in many forms. It is well known that high-precision ADCs are slow and that fast ADCs are imprecise.

To improve the precision, it is common-to .calibrate the converters. This associates an error value with each output value. The measured errors are written in the locations of a read-only memory (ROM).

An adder circuit adds the value output by the converter to the algebraic error value read from the memory location in order to obtain a correct result. This type of ADC enables errors due to non-linearity, offset and gain to be reduced. On the other hand, neither errors due to defects of the whole conversion circuit which includes the converter, nor those due to gain and/or offset variations (resulting from temperature changes) are corrected.

SUMMARY OF THE INVENTION

In the context of this state of the art, the present invention proposes a high-resolution analog-to-digital converter offering high linearity (10 bits or more) and high speed (>several MHz) over a wide temperature range (−55° C. to +125° C.).

In addition, the invention provides these advantages at reduced cost.

For this purpose the invention uses standard commercial products based on monolithic integrated circuits of average performance and much lower cost than the hybrid circuits required to obtain high-performance ADCs.

These standard products used are:

- a medium- or high-speed analog-to-digital converter (ADC), for example a flash or multi-pass converter;
- a very high resolution digital-to-analog converter (DAC), precise but possibly slow;
- a fast analog switch preferably with high rejection;
- a microprocessor, microcontroller or sequencer;
- a set of random access memory (RAM) circuits.

The layout and operation of these components is as follows:

The voltage to be converted is sent to the ADC via the switch. The output value from the converter determines the address of at least one RAM storage location.

These addressed locations contain a correction value which is added by an adder circuit to the output value to give a corrected value.

Depending on the programming of the microprocessor, the conversion cycle may be continuous or interrupted to enable insertion of calibration phases. This calibration is achieved as follows:

A microprocessor command interrupts the conversion cycle. This interruption is accompanied by a microprocessor command which switches the analog switch.

In this position, the switch receives the output from the DAC. The ADC converts the value received from the DAC. The DAC being precise, the difference between the output value of the ADC and the known output value of the DAC constitutes the correction value which must be applied to the output of the ADC each time it outputs this particular value.

The correction value determined in this way should therefore be stored in the memory location whose address is the same value as the value output by the ADC.

This memory write operation is executed during a calibration phase whose sequencing is controlled by the microprocessor. This calibration consists in measuring the real value which must be injected into the ADC to obtain a given output value. To do this, we inject into the ADC is a series of values, increasing for example, in a range likely to produce the output value sought. When the ADC outputs the awaited value, the microprocessor accesses the RAM storage location corresponding to this output value and writes in it a value equal to the algebraic difference between the real voltage injected by the DAC and that measured by the ADC.

The DAC requires a relatively long period for its controlled output tension to be established. This is why a certain sequencing of the measurement operations is necessary. When a calibration measurement has just been made, the microprocessor switches the analog switch back to its measuring position. The conversion of the voltage to be converted can then continue.

In parallel, the microprocessor generates the new calibration value for the DAC. A new calibration measurement will be made only after the time necessary for the output of the DAC to reach a stable value.

Consequently, the writing of correction values in all the memory storage locations is relatively long. However, if we suppose that the time for establishment of the output at the terminals of the DAC is 10 µs, this gives a total calibration time of about k×0.7 ms for a 16 bit ADC ($2^{16}$ positions×10 µs=0.65 ms). This time, even if it were several seconds, it can be considered to be relatively short since temperature changes are generally gradual.

The number k is the number of measurements to be made to determine the two numerical values input to the DAC between which we obtain a unit change of the ADC output value.

The basic idea of the invention is based on the observation that what takes the longest time in a calibration measurement of a fast ADC is the time to establish a stable and precise reference voltage. When this voltage is established, the conversion of this voltage by the ADC is very rapid. Therefore, if we have a fast analog switch to replace the voltage to be converted by the calibration voltage, and vice versa, we can calibrate the ADC quasi-continuously without interrupting the conversion cycle.

To summarize, the invention concerns a process for conversion of an analog value X, which can range between limits $X_1$ and $X_2$, into a numeric value N ranging between limits $N_1$ and $N_{2^n}$ and comprising a sequence of bits, each bit having a weight depending on its position in the sequence, the values $N_1$ and $N_2$ corresponding to the values $X_1$ and $X_2$ and $2^n-1$ intermediate values $N_i$ between $N_1$ and $N_{2^n}$ each corresponding to an intermediate value $X_i$, the pth numeric value after $N_1$ corresponding to the value:

$$X_p = X_1 + p\left(\frac{X_2 - X_1}{2^n}\right),$$

the process being implemented using a measuring circuit to which is input the instantaneous value $X_j$ of the analog value X and which outputs the corresponding numeric value $N_j$, the process being of the type in which a previous calibration is used to assign a correction value $h_j$ to each output numeric value $N_j$, wherein the calibration measurements are repeated throughout the conversion process without interrupting the conversion measurements.

The invention also describes a device for conversion of an analog value X, which can range between limits $X_1$ and $X_2$, into a numeric value N ranging between limits $N_1$ and $N_{2^n}$, the values $N_1$ and $N_{2^n}$ comprising a succession of bits, each bit having a weight depending on its position in the succession, the values $N_1$ and $N_{2^n}$ corresponding to the values $X_1$ and $X_2$ and $2^n-1$ intermediate values Ni between $N_1$ and $N_{2^n}$ each corresponding to an intermediate value Xi, a pth numeric value after $N_1$ corresponding to the value:

$$Xp = X_1 + p\left(\frac{X_2 - X_1}{2^n}\right),$$

the device including an ADC receiving an instantaneous input value $X_j$ and generating at its output a numeric value $N_j$, the device including a first block of memory locations, an adder receiving the value output by the converter and also receiving the correction $h_j$ obtained from a memory location in the first block whose address is determined by the numeric order of magnitude $N_j$, the value $N_{jk}$ output by the device being equal to the sum of the values $N_j$ and $h_j$, wherein the device includes upstream of the converter, a controlled analog switch with at least two positions, a measuring position and a calibration position, the switching from one position to the other being controlled by a sequencer. When the switch is in measuring position, the converter receives the instantaneous value $X_j$ to convert and outputs the numeric value $N_j$ which is applied to the input of the adder, the other input of the adder receiving the value $h_j$ from the first memory block, the adder generating an output equal to $N_{jk}=N_j+h_j$. When the switch is in calibration position the converter receives an instantaneous reference value $X_{jr}$ from a DAC and generates an output value $N_{jr}$ which is applied to the input of a microprocessor, this microprocessor updating the memory location having the address $N_{jr}$ in a second block of memory locations, the sequencer controlling the inversion of the first and second memory blocks once the calibration phase is complete, the second memory block then becoming the correction memory block and the first block becoming that receiving the calibration values.

BRIEF DESCRIPTION OF THE DRAWINGS

A general embodiment of the invention and two specific embodiments are described below with reference to the appended drawings, in which:

FIG. 1 shows a diagram of a general method of implementation of the invention.

Figure 1:
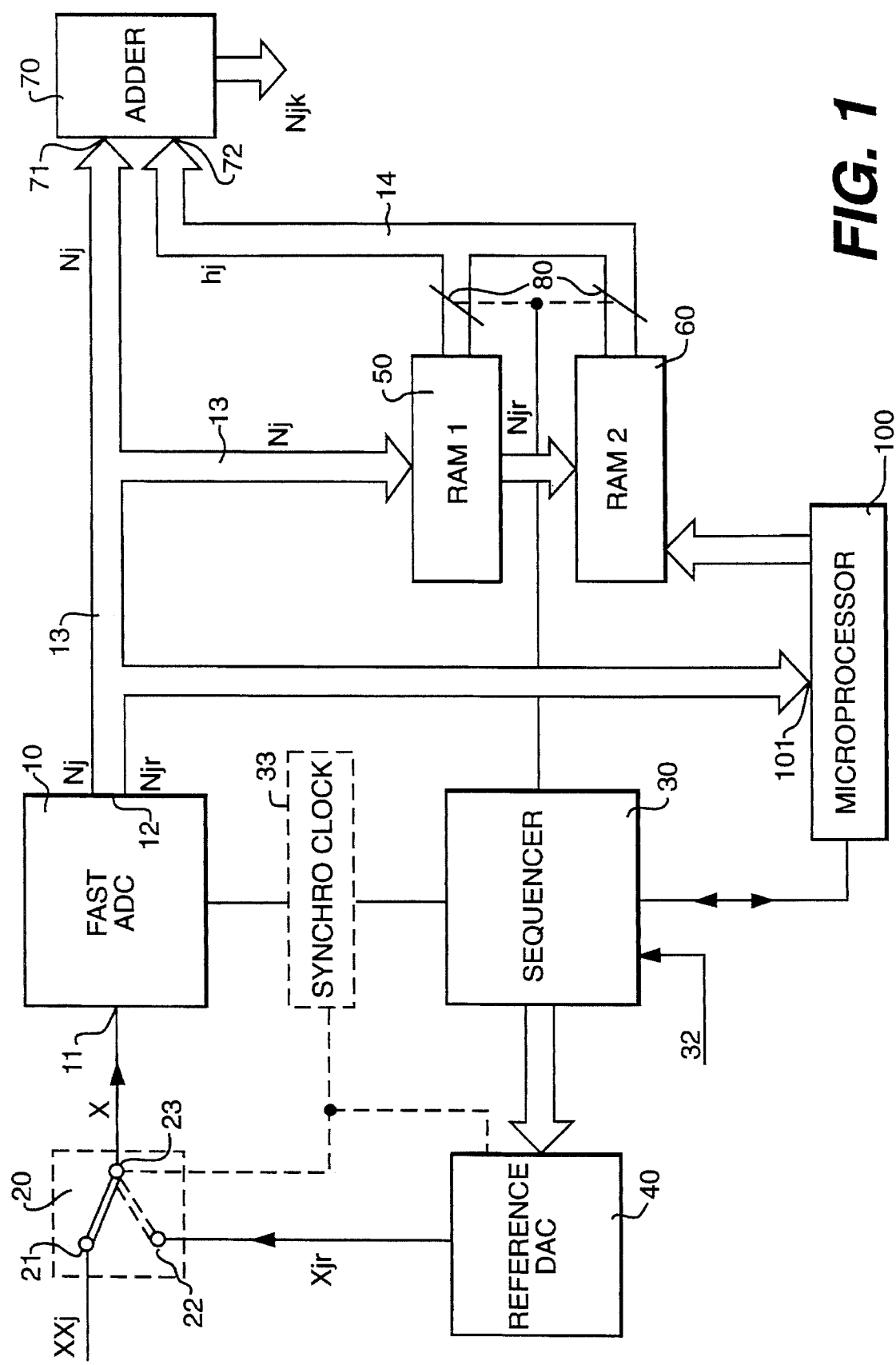
FIG. 1 shows a diagram of a general method of implementation.

A value $X_j$ of an analog quantity X is applied to the input 11 of an ADC 10. The converter is for example a flash converter. The value $X_j$ is applied to the input 11 via an analog switch 20. A contact 23 of the switch can be connected either to an input contact 21 receiving the value X to be measured, or to a contact 22 receiving a reference value $X_{jr}$. The switching from one contact to the other is controlled by a sequencer 30. The switch 20 must have a switching time substantially equal to half the time between two successive samplings. At this conversion speed the switch's rejection must be high.

The description and operation of the device shown in FIG. 1 will be described below, first with the switch 20 in measuring position (with contact 21 connected to contact 23 as shown by the solid line) and secondly in calibration position (with contact 22 connected to contact 23 as shown by the hatched line). The value $N_j$ representing at the output 12 of the ADC, the equivalent numeric value of the value $X_j$ converted by the ADC 10, is applied via a bus 13 to an input 71 of an adder 70 and is also used by another branch of this same bus 13, operating in this case as an address bus, to address a memory address $N_j$ of a first block 50 of memory locations. The value stored in this memory location is applied via a bus 14 to a second input 72 of the adder 70. The value $N_{jk}$ output by the adder 70 is the corrected value of the measuring device.

In the calibration position in which the contacts 22 and 23 of the switch 20 are connected to each other (as shown by the hatched line), the input 11 of the ADC 10 receives a reference analog value $X_{jr}$ generated by a DAC 40. The value $X_{jr}$ is controlled by the sequencer 30.

It is preferable to use a DAC 40 with a resolution of at least two bits more than the ADC 10. In other words, if the ADC generates a 16-bit output the DAC should convert to at least 18 bits. The reference value $X_{jr}$ is converted by the ADC 10. The output value $N_{jr}$ of the ADC at 12 is used to address a memory location with this address $N_{jr}$ in a second memory block 60 and is also applied to an input port of the microprocessor 100.

The value $N_{jr}$ is subtracted from the value $X_{jr}$ applied to the DAC and the value of the difference is written into the memory location of the second memory block 60 at address $N_{jr}$ indicated by the output of the ADC 10.

The process is iterative. When the last memory location of the block 60 has been written, the sequencer 30 switches the input 72 of the adder 70 to the memory block 60.

The means of switching are showed symbolically by the switches 80 controlled simultaneously by the sequencer 30. The memory blocks 50 and 60 then change their roles: the block 50 become the block in which correction values are written and the block 60 is used to obtain corrections for measurements in progress.

The control of the calibration measurements can either be autonomous and internal to the sequencer 30, or external.

When the control is internal the minimum interval between two calibration measurements is equal to the minimum time required to establish a stable voltage at the output of the DAC 40. This minimum time is measured in terms of a number of pulses of a clock 33 used to synchronize the ADC 10, the DAC 40 and the sequencer 30.

The period of this clock must not exceed half the required period of conversion for the converter 10. In FIG. 1, the clock 33 is shown as being separate, but it is obviously possible to use other clocking signals present in one of the circuits 10, 30, 40 or 100. The calibration measurements are inserted periodically between conversion measurements.

The switch 20 is switched to a calibration position (contact 22) and remains in this position for the duration of the calibration measurement and is then switched back to contact 21 to continue the conversion of the input tension X. Using internal control, in view of the need to execute periodically a calibration between two conversion measurements, in practice the maximum rate of conversion obtained from the ADC 10 is half the nominal conversion frequency.

When the control is external to the sequencer 30, we attempt to make full use of dead periods between conversions, i.e. times when there are no conversions to be made. The start of such a dead period is signalled to the sequencer 30 by a status bit received at 32; the end of the dead period is signalled by a change of value of this bit. In this case the frequency of the calibration measurements is always limited by the time required to establish the voltage at the output of the DAC 40; on the other hand, the ADC 10 can be used at maximum capacity.

An example of the alternation between conversion and measurements is illustrated in FIG. 2.

In this figure the small vertical arrows represent the instants of conversion measurements, the horizontal scale representing the time. The large arrows represent the calibration measurements.

Figure 2A:
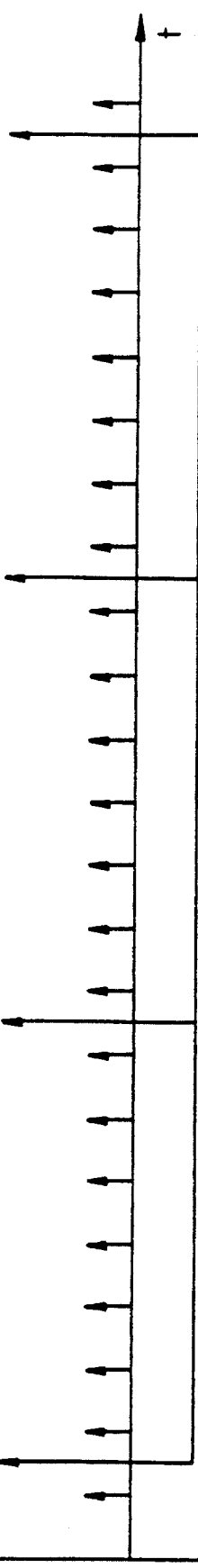
FIGS. 2a and 2b show examples of the alternation of the conversion and calibration measurements.

In FIG. 2a the sequencer 30 is internally programmed; the calibration measurements are made at regular intervals between conversion measurements.

Figure 2B:
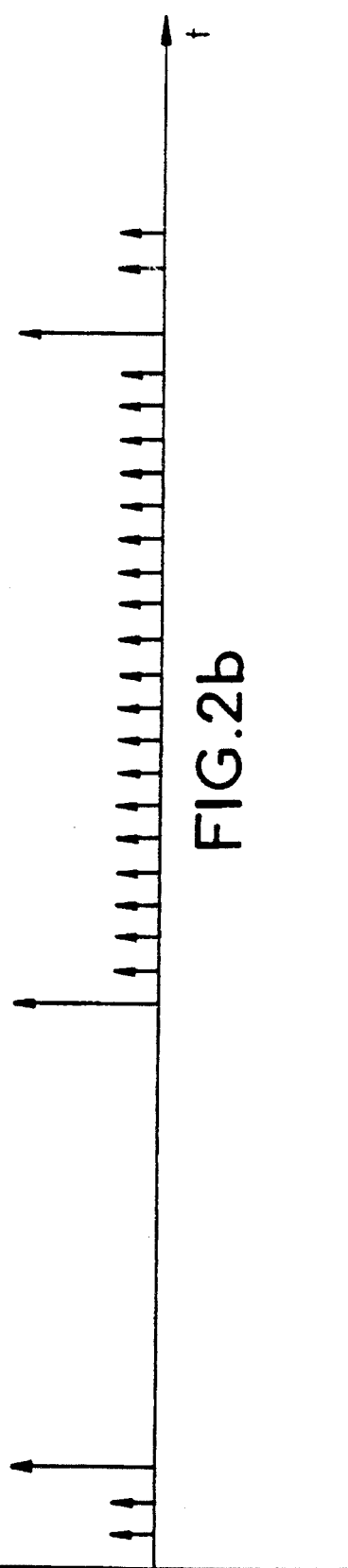

In FIG. 2b the sequencer 30 is programmed using an internal law which enables it to trigger calibration measurements at intervals at least equal to the time for establishment of the output voltage of the DAC 40, although the precise times possible for this measurement are externally controlled. In this case, the calibration measurements are more irregular. FIG. 2b shows a case in which the interruption time was sufficient for two successive calibration measurements to be made, followed by a third one which, owing to the permissible interruption time, only permitted a single calibration measurement. We note in FIG. 2b that the intervals between the conversion measurements is half that in FIG. 2a since in this case the ADC 10 can operate in the measurement phase at its maximum nominal frequency.

Figure 3:
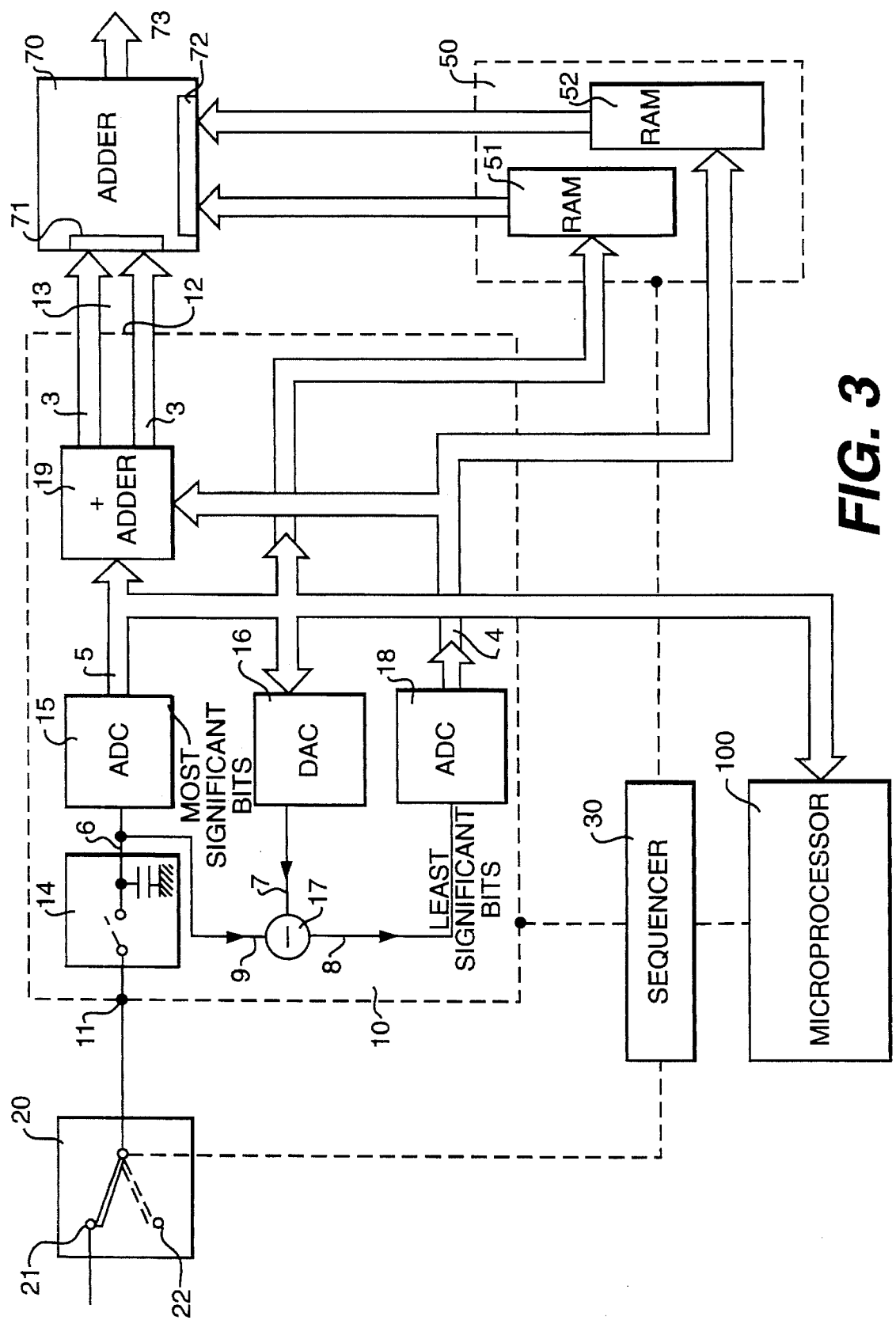
FIG. 3 shows the measuring phase of an embodiment making use of a multi-pass ADC.

FIG. 3 shows an embodiment, during its measurement phase, in which a multi-pass converter is used. To understand the invention better, we give quantified values for this example of an embodiment, although, of course, this embodiment is not limited to the example used.

The example involves a multi-pass converter including two 6-bit ADCs, one used for the most significant bits (hereafter referred to as MSBs or "high bits"), the other for the least significant bits (hereafter referred to as LSBs or "low bits"), the two overlapping by 2 bits, so that they together provide a 10-bit conversion. In these conditions, as explained earlier, it is preferable to use a 12-bit DAC 40.

In FIG. 3 the components having the same function as in FIG. 1 carry the same reference.

First, we shall describe the multi-pass converter 10 in FIG. 3 and its operation. This type of converter is commercially available. The description and operation given below are simply intended to facilitate the understanding of the use of this component in the invention.

The converter includes a sample and hold circuit 14, an ADC 15 for the high bits, a DAC 16, a subtractor 17, an ADC 18 for the low bits and an adder 19.

The operation is as follows: the incoming voltage at 11 is sampled and its instantaneous value is conserved by the sample and hold circuit 14. The sampler output voltage at 6 is applied to the input 9 of the subtractor 17 and is also converted by the ADC 15 which converts only the MSBs. The resulting numeric value at the output 5 of the ADC 15 is applied to the input of DAC 16 and is converted by this converter into an analog voltage applied to the other input 7 of the subtractor 17. The subtractor output at 8 is applied to the ADC 18 used for processing the LSBs. The numeric outputs 5 and 4 from the ADCs 15 and 18 respectively are applied to the two inputs of the adder 19. The output 3 from this adder represents the result of the conversion. Suppose, for example, that we wish to use a 10-bit converter (having therefore 1024 possible values) to measure a voltage ranging from 0 to 1023 mV. The weight of the least significant bit is then 1 mV. If we take two 6-bit converters, each with $2^6=64$ values, we could use steps of 16 mV for the ADC 15 used for the most significant bits, which will enable measurements between 0 and 16×63=1008 mV, and 1 mV steps for the converter 18, enabling measurements between −32 mV and +32 mV.

Now suppose that the converters 15 and 18 chosen and used in this way and the DAC 16 are all perfect and that we wish to measure a tension of 955 mV.

The converter 15 will give a binary result whose decimal value is 59 or 60, since 955=16×59+11, 16×59 and 16×60 corresponding to the binary values 111011 and 111100. If we assume that the DAC 16 is sufficiently precise to generate results of 944 mV in a first case and 960 mV in a second case, we shall find +11 mV or −5 mV at output 8 of the subtractor 17, corresponding respectively to the binary values +001011 or −000101. In the first case, the addition of the binary value 111011 in which the LSB is 16 and the binary value 001011 in which the bit of weight 16 is the fifth from the right will yield the following binary number:

```
  1110 | 11 |
+      | 00 |1011
= 1110 | 11 |1011
``` a binary value whose 10 bits are equivalent to the decimal value 955. The two MSBs of the ADC 18 and the two LSBs of the ADC 15 overlap; these two bits have the values 16 and 32 mV.

Similarly, in the second case we have:

```
  1111 | 00 |
-      | 00 |0101
= 1110 | 11 |1011
```

The latter value corresponds to the decimal value 955, which was the value we wished to measure.

The operation described above for the multi-pass converter 10 in FIG. 3 is based on the supposition that this converter operates perfectly. In reality this is not necessarily true. For this reason, the present invention proposes a correction of the value at the output 3 of the adder 19 included in the multi-pass converter 10, by adding a correction value by means of an adder 70. The correction value is obtained, as in the general case represented in FIG. 1, from a memory 50. This memory is however divided into two blocks of storage locations. The first block 51 provides a correction for the MSBs appearing at output 5 of the ADC 15; the memory location addressed is the one whose address is equal to the numeric value of the output 5 of the ADC 15. A second block 52 provides a correction for the LSBs; the memory location addressed is the one whose address is equal to the numeric value of the output 4 of the ADC 18.

The advantage of this approach is to reduce the size of the required memory block. For example, for a 10-bit coder with $2^{10}=1024$ elementary codes, a 1024-location memory block would be needed. With two 6-bit ADCs (and 2 overlapping bits) only $2^6+2^6=128$ memory locations are required, each location containing only the error of the ADC 15 or 18 relative to the true value of each conversion level.

With the exception of the measurement correction mode which is carried out as explained above with two channels, one for the MSBs and the other for the LSBs, the operation of the device in measuring mode is identical to that described with reference to FIG. 1. The clock used is that of the ADC 10.

The calibration mode will now be described with reference to FIG. 4.

Figure 4:
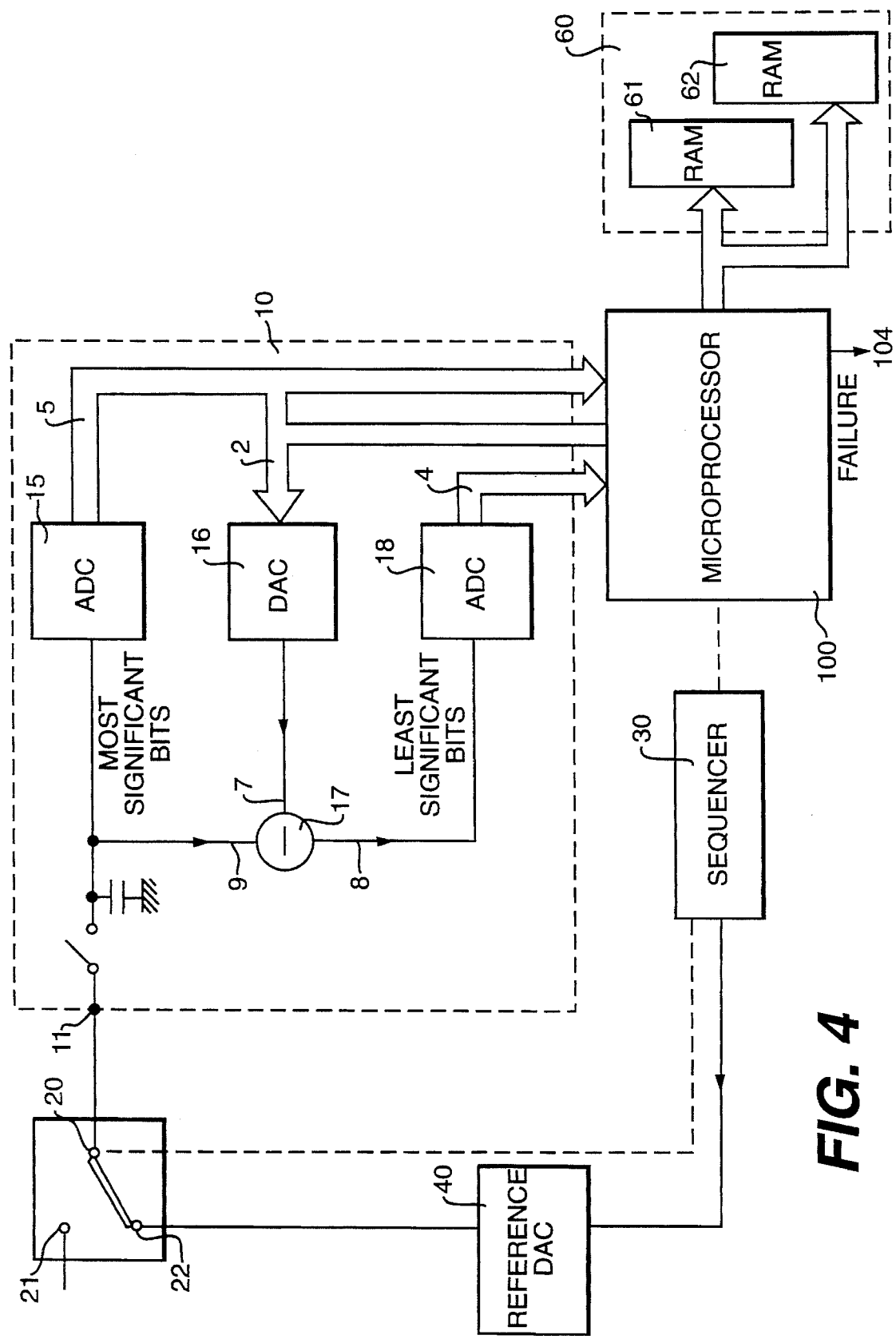
FIG. 4 shows the same embodiment as in FIG. 3 during the calibration phase.

Although FIGS. 3 and 4 represent the same physical circuit; to facilitate the reading of the diagram we have shown in FIG. 3 only the components involved during the measuring phase with the corresponding bus connections. In FIG. 4 only the components used in the calibration phase are shown with the corresponding bus connections.

The self-calibration circuit operates, as explained earlier, at relatively low speed. The minimal repetition period of the calibration operation depends on the program of the sequencer 30 and the speed of establishment of the reference voltage at the output of the DAC 40. A calibration measurement consists in generating a very precise voltage at the output of the DAC 40. By "very precise" we mean a voltage of higher precision than that of the ADC 10.

One extra bit of precision would be enough. Thus, for a 10-bit ADC 10, whose LSB corresponds to 1 mV, an 11-bit DAC 40 whose LSB for the same total range corresponds to 0.5 mV may be sufficient in certain GBSeS.

In the embodiment with a 10-bit ADC 10, a 12-bit DAC has been chosen, i.e. 2 extra bits. We can then generate values whose LSB corresponds to a quarter of the LSB of the ADC 10, that is 0.25 mV. After the time required to establish the voltage at the terminals of the DAC 40, it is possible to order the switching of the analog switch 20 in order to make a rapid measurement.

In the present embodiment, the internally-controlled mode has been chosen: the switching to a calibration measurement is therefore made between two conversion measurements. The data obtained are then processed by the microprocessor 100 to write a value in the memory block not being used for conversion measurements.

A complete calibration phase can be broken down into two main phases. The first is the measurement of the error on the LSBs and the second is the measurement of the error on the MSBs.

The measurement on the LSBs enables measurement of the error of the low bits ADC 18 increased by the offset error of the DAC 16, included in the ADC 10. To do this, during this phase the microprocessor 100 applies a zero value to the DAC 16. In this way the value measured by the low bits ADC 18 is the value received from the DAC 40 on the input 9 of the subtractor 17, minus the offset voltage of the DAC 16, received on input 7 of this subtractor. This value is the value present at the output 8 of the subtractor 17. For each possible binary value of the low bits ADC 18 (i.e. ±32=2⁶= 64), we search by successive approximation or by linear scanning or by dichotomy, the test values which bracket the real value for which the ADC 18 switches from one output value to the next higher. An example will be described below as an illustration. Supposing we have a 10-bit coder with two overlapping bits, the full range covering 1023 mV, the value of the LSB being 1 mV, and the reference DAC 40 having 12 bits with an LSB value of 0.25 mV. In addition, we suppose that the maximum error at the output of the ADC 18 (therefore including the offset error of the DAC 16) is at most 8 mV, or $2^3$ times the LSB value.

We wish to measure for what real voltage the output of the ADC 18 will change from 13 to 14 (or 001101 to 001110 in binary).

A possible measuring sequence could be as follows:

| Output value of controlled DAC 40 | Does the ADC switch to value | | Modification of voltage placed on the DAC 40 |
|---|---|---|---|
| | >14 | =14 | |
| 14 mV | NO | NO | Increase by 8 mV |
| 22 mV | YES | NO | Reduce by 4 mV |
| 18 mV | YES | NO | Reduce by 2 mV |
| 16 mV | NO | YES | Reduce by 1 mV |
| 15 mV | NO | NO | Increase by 0.5 mV |
| 15.5 mV | NO | NO | Increase by 0.25 mV |
| 15.75 mV | NO | NO | End of test |

In such a case the programming of the microprocessor enables us to conclude that the switching to the value 14 occurs for a value between 15.75 and 16 mV. The microprocessor will then write the correction value 15.75−14= 1.75 mV (1.11 in binary) in the memory location having address 14 in the block 62 of the memory 60 used for corrections of the LSBs.

With the hypotheses and the iteration method used in this example we see that whatever the real value of the switching, we are always able to bracket it between two values whose difference in value is equal to the minimum increment value of the reference DAC 40. In the case chosen, the number of measurements required is k=7.

The number of measurements k is therefore a number which depends on the admissible error in the ADC 10 to be calibrated, on the iteration mode used, and on the precision required on the switching value.

In the example described above, the iteration is carried out by assigning to the initial test value the value at the output of the ADC 10. In the example above, this value was 14. Next the test value was increased by the total of the admissible error, i.e. 14+8=22 mV. If a change of value had not occurred, we would have reduced the test value by the total admissible margin of the error, i.e. in the present case 14−8=6 mV.

If switching still does not occur, the microprocessor 100 generates an alarm 104. If, on the other hand, one of the two preceding tests causes switching, the value used for the following test will be the value of the present test increased or reduced by half the difference between the present test value and the preceding test value.

In the example described, we see that in fact the number of measurements k needed to determine the two values bracketing the switching value is equal to 8 since it is first necessary to determine if the error of the ADC 10 is positive or negative.

In practice, with the possible exception of the first measurement of an initial calibration measurement, we assume that the error of the ADC 10 always has the same sign, if the error exceeds a certain threshold. If, on the other hand, it is close to zero (i.e. sometimes positive, sometimes negative), this simplification is no longer possible.

When all the possible outputs have been tested, each location of the memory blocks 62 for correction of the LSBs contains the value required to correct the output whose value is equal to the address of the memory location.

Before explaining the correction of values given by the high bits ADC 15, a table A is given below. This shows a few fictitious examples of measuring results thus obtained. In the table, the 6-bit memory addresses corresponding to negative values output from the ADC start with 1 and those corresponding to positive values output start with 0.

TABLE A

| Output value of the ADC 18 | Default switching value (mV) | Correction value | Memory 62 Address | content in binary 6 bits | 2 bits |
|---|---|---|---|---|---|
| 1 | 2 | 3 | 4 | 5 | 6 |
| −32 | | | 100000 | | |
| −9 | −5.75 | +3.25 | | | |
| −7 | −3.5 | +3.5 | | | |
| −4 | −1.25 | +2.75 | | | |
| −3 | −1 | +3 | | | |
| −1 | +2 | | 111111 | 000011 | 00 |
| 0 | 3.25 | +3.25 | 000000 | 000011 | 01 |
| +1 | 4.25 | +3.25 | 000001 | 000011 | 01 |
| +2 | +5.0 | 3 | 000010 | 000011 | 00 |
| 13 | 14.25 | 1.25 | 001101 | 000001 | 01 |
| 14 | 15.75 | 1.75 | 001110 | 000001 | 11 | bits ADC 18. At the address 13 of the low bits correction memory block, the correction value written is 1.25 mV.

In this situation, the microprocessor 100 is programmed to write at address 18, of the high bits correction memory block 61, the value equal to the sum of the output value of the ADC 18 (=13) and the correction value written in memory location 13 of memory block 62 (=1.25). In our example, the correction written at address 18 of the memory block 61 is 14.25. The same writing operations of input correction values for the DAC 16 are carried out for each possible output numeric value from the high bits ADC 15. In the example embodiment, the number of measurements is therefore $2^6$=64.

In order to provide additional explanations of the advantages offered by the device according to this invention, the table B below shows some fictitious examples of measurement results obtained:

TABLE B

| High bits ADC 15 | | | | Low bits ADC 18 | | | Address in the |
|---|---|---|---|---|---|---|---|
| Output value from ADC 15 | Theoretical value | Translated value | Output value at 8 | Output value from ADC 18 | Correction value rapid | precise | correction memory block 61 |
| 1 | 2 | 3 | 4 | 5 | 6 | 7 | 8 |
| 0 | 0 | | | | | | 000000 |
| 1 | 16 | | | | | | |
| 18 | 288 | 303 | +15 | 13 | 13 + 1.25 = 14.25 | 13 + 1.75 = 14.75 | 010010 |
| 19 | 304 | 309 | +5 | 1 | 1 + 3.25 = 4.25 | 1 + 3.75 = 4.75 | 010011 |
| 20 | 320 | 317 | −3 | −7 | −7 + 3.5 = −3.5 | −7 + 3.75 = −3.25 | 010101 |
| 63 | 1023 | | | | | | |

TABLE A-continued

| Output value of the ADC 18 | Default switching value (mV) | Correction value | Memory 62 Address | content in binary 6 bits | 2 bits |
|---|---|---|---|---|---|
| 1 | 2 | 3 | 4 | 5 | 6 |
| 15 | 17.25 | 2.25 | 001111 | 000010 | 01 |
| +32 | | | 011111 | | |

The calibration procedure of the high bits ADC 15 will now be explained.

The microprocessor 100 injects on the input 2 of the DAC 16 one of the values corresponding to a possible output value of the ADC 15, for example, the numeric value 18. At the same time, the theoretical value of the voltage corresponding to this numeric value is generated at the output of the DAC 40. In the example chosen, this would be 18×16 mV =288 mV (we recall that the step of the ADC 15 is 16 mV). The value at the output 8 of the subtractor 17 therefore represents the error introduced by the DAC 16 and the subtractor 17, when the DAC 16 receives the numeric value from the microprocessor and the subtractor receives the theoretical value, 18 in our example. Suppose that the real value present at the output 8 of the subtractor 17 is 15 mV. Consulting the fictitious table, given as an example, we note that 15 mV lies between 14.25 and 15.75 mV. This value therefore generates the value 13 at the output 4 of the low The value appearing in the 6th column is equal to that in the 5th column increased by the correction value taken from column 3 of table A corresponding to the value in column 5 of table B. The value appearing in column 7 will be explained later.

We shall show later that by increasing the number of calibration measurements, it is possible to increase the precision of the correction value written in each location of the high bits correction memory block 61.

A fictitious example of a conversion of a value will be given below in order to highlight certain precautions to be applied when using the device according to the invention.

Supposing that a voltage of 308 mV (=16×19+4) is placed on input 11 of the ADC 10 in measuring mode. For this value, the ADC may output numerical values 18, 19 or 20.

We have seen in table B that for the numeric value 18 input to the DAC 16, and the value 288 on input 9 of the subtractor 17, the output value at 8 of the subtractor is 15 mV. In the example we have chosen, the real value at the input 9 of the subtractor 17 is 308 mV (=288+20). If we suppose that the error of the subtractor itself is constant over the range 288±32 mV, we can estimate that the voltage which will appear at the output 8 of the subtractor 17 will be (288+20)−(288+15)=5 mV.

According to table A, we know that at least 4.25 mV is required to switch the ADC 18 to 1 and at least 5 mV to make it switch to 2. At one step above 5 mV the ADC output is sure to switch to 2 (we can say that 5 mV is "lower bracking value" of the output value 2). For the input value 5 mV, the ADC 18 will probably switch to 1. For this value, the correction value read from memory if 3.25.

The correction of the LSBs will therefore give the value 1+3.25=4.25.

The correction of the MSBs read in memory location 18 is 14.25 (see table B). The converted value is therefore:

$$18 \times 16 + 14.25 + 1 + 3.25 = 306.50$$
$$\text{---High bits---} \quad \text{---low bits---}$$

The error is 1.5 mV or, more generally, 1.5 times the value of the least significant bit.

If we now suppose that the ADC 15 outputs the value 19, we see from table B that the value at output 8 is +5 when there is 304 (19×16) at the input to the subtractor 17. Making the same assumption concerning the internal error of the subtractor 17, we can estimate that the voltage which will appear at output 8 of the subtractor 17 will be:

$$(304+4)-(304+5)=-1 \; mV$$

According to table A, we know that the switching value of the ADC 18 to −4 is caused by an input value between −1.25 (lower bracketing value) and −1 (higher bracketing value). The output from ADC 18 will therefore be −4, which corresponds to a correction value of +2.75. The correction of the LSBs will therefore give the value:

$$-4+2.75=-1.25.$$

and the correction of the MSBs will give the value:

$$19 \times 19 + 16 + 4.25 = 308.25$$

The corrected sum of the MSBs and LSBs output by the converter 10 will be 308.25−1.25=307 mV.

A description of the measurement using the value 20 output by the ADC 15 will not provide any additional information of interest and will not be given. We observe that the errors on the LSBs or on the MSBs are of the order of 1 mV, giving a total possible error of about 2 mV or, more generally, two times the value of the LSBs. In order not to exceed this margin of error, the residual value remaining to be measured by the ADC 18 must remain in the input range of the ADC 18. This residual value is equal to (to within the intrinsic error of the subtractor 17) the difference between the real value at the input of the ADC 15 and the value appearing at the output of the ADC 15, after conversion into a numeric value by the ADC 15 and re-conversion into an analog value by the DAC 16. In our embodiment example, this input range is that shown in column 2 of table A between the value giving the output of +32 mV and that giving an output of −32 mV. We accept that this range in fact runs from −32+Δ to +32+Δ, where Δ is a correction value assumed to be the same for output values +32 and −32.

In order for this condition to be true it is important that the ADC 15 gives only values n−1, n or n+1 for input values between:

$$(n-\tfrac{1}{2}) \times 16 \; and \; (n \times \tfrac{1}{2}) \times 16$$

i.e. an error equal to, at most, 1.5 times the measuring step.

We mentioned earlier during the description of the correction of the MSBs that it was possible to refine the correction value of the MSBs by making a larger number of measurements. In this case, the approach is as follows:

We recall first of all that in order to determine the MSB correction value to apply when the ADC 15 outputs a numeric value n, the microprocessor inputs the value n to the DAC 16 and also sends to the reference DAC 40 the value equal to n times the measuring step. The difference between the real value and the converted value appearing at the output 8 of the subtractor 17 is measured by the low bits ADC 18, this measured value being corrected by adding the value stored at the memory address corresponding to the output value of the ADC 18 in the low bits correction memory block 62. In the example which was described, we supposed, for an output value 18 (corresponding to 288 mV for a step of 16 mV), that the value appearing at the output of the subtractor 17 was 15 mV, which the ADC 18 interpreted as a value 13 corrected by addition of the correction read at address 13 of the memory block 62, in this case 1.25 mV, the correction written in address 18 of memory block 61 then being 14.25.

Returning to this example and to table A, the microprocessor 100 can calculate that when the value 13 appears on the output of the DAC 18 the input value lies between 14.25 (minimum) and 15.75+0.25=16 (maximum). We recall that these values 14.25 and 15.75 are the lower bracketing values (within 0.25 of the switching value) of the values causing switching to 13 and 14 respectively.

In order to refine the MSB correction, we try to determine by how much the value at the input 9 of the subtractor must be increased to cause the ADC 18 to switch to the next higher numerical output value. Thus, in our example, while maintaining 18 at the input to the DAC 16, the microprocessor 100 generates the value 288.25 at the output of the DAC 40, i.e. at input 9 of the subtractor 17. It is accepted that for small increases the intrinsic error of the subtractor 17 is negligible and that instead of 15 at the output 8 we will have 15.25. For this new value the output of the low bits ADC 18 does not change. We then continue to increase in steps of 0.25 the output value of the DAC 40 until we arrive at the value 16 at output 8 of the subtractor 17, the value at which the ADC 18 switches to 14.

In this example we see that the value at the output 8 had to be increased by 1 (4×0.25) to cause the switching to 14. If the real value at the output 8 had been within the switching range to 13 of the ADC 18, that is between 14.25 and 14.50, an increase of at least 1.5 mV would have been necessary, i.e. 6 steps of 0.25 to arrive at a value between 15.75 and 16 in order to cause the ADC 18 to switch to 14. The fact that only 4 steps were needed to cause switching allows us to conclude that the real value which was present at the output 8 is at least 2 steps higher than the lower bracketing value of the switching value to 13. The value which will be written in the memory location 18 of the high bits block 61 will then be 14.75 instead of 14.25.

The correction value obtained in this way, referred to as the high bits "precise correction", is shown in column 7 of table B.

This approach enables the high bits correction to be obtained to within 0.25 mV below the exact value.

The error on the low bits is, for a given measurement of the low bits, equal to the difference between the value as it is measured and the value necessary to obtain the next higher numerical output value on the low bits ADC 18. Thus, for example, the low bits value 13 is obtained for all real values from 14.25 (lower bracketing value) to 15.75 (higher bracketing value), or 1.5 mV in this case. The output value of the ADC 10 is therefore a low value with a possible error which in this case at most 0.25+1.5 mV=1.75 mV.

In the case in which we accept a fast but less precise calibration mode, the value obtained for the high bits is a low value whose maximum error is equal to twice the maximum error possible for the numeric value obtained at the output of the low bits ADC 18. Thus, for example, if the conversion of the value $X_j$ gives 18 at the output of the ADC 15, we have seen in table B that the value $X_j$ is considered to be equal to 18×6+14.25.

This value is a low value. The high bits correction in the memory location 18 of block 61 could have remained the same if the value $X_j$ had been increased, but at a value insufficient to make the low bits ADC 18 switch to 14. It then follows that the total error is equal to twice the error on the low bits for the output value 13. This error occurs once during the high bits correction, and again during reading of the low bits.

Whatever calibration mode is chosen, it is easy to introduce in the calibration program a self-test module which enables an alarm 104 to be generated in at least one of the following cases:

First case: the high bits ADC 15 gives a numeric value which differs from the real value by more than 1.5 times the step of this ADC.

Second case: the difference between the lower bracketing values of the switching values of the ADC 18 from one numeric output value to the next higher value is, for at least one numeric value, greater than a predefined threshold. This alarm signal generated by the microprocessor is represented by 104 in FIG. 4.

We see from the preceding explanation that the maximum error over the measuring range is at least equal to the value of a measuring step of the low bits ADC 18, increased by the value of one binary input step of the reference DAC 40.

At the adder, the input 71 receives a 10-bit value whose LSB represents the step of the low bits ADC:16; the input 72 receives a value with, for example, 8 bits whose LSB represents the step of the DAC 40.

In our embodiment example, the sum of the values received at the inputs 71 and 72 therefore corresponds to a 12-bit value rather than a 10-bit value. The minimal error is, as we have seen, at least 1.25 steps of the ADC 18. The maximal value of the two least significant bits output by the adder 70 being 0.75 times the step of the ADC 18, they are quite insignificant. This is why the output of the ADC according to the invention is a 10-bit value, the two lowest bits being ignored.

The switchings and sequencing required for the operation of the circuit shown in FIGS. 3 and 4 are known to professionals of the art and are deliberately not described in order to concentrate on the explanation of the features peculiar to the present invention.

In the description of a second embodiment given below with reference to FIG. 5, the principles will be described in less detail. Some explanations will be given enabling the professional to design the switchings and sequencing.

Figure 5:
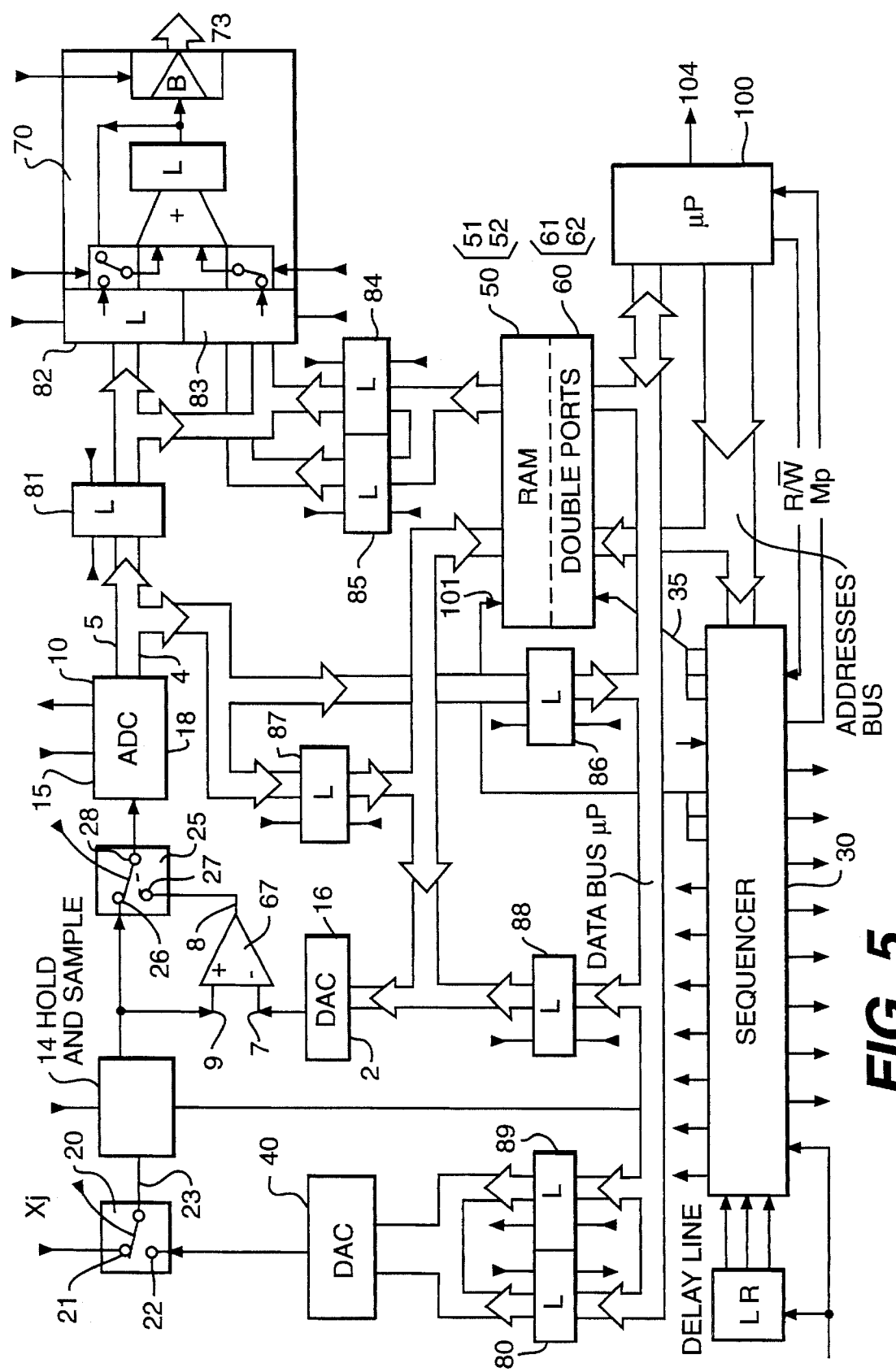
FIG. 5 shows a second embodiment using the same ADC twice for a given measurement, the first time for the most significant bits and the second time for the least significant bits.

The model shown in FIG. 5 was used to validate the invention; it is not optimized. For this embodiment we have attempted to simplify the wiring operations.

In FIG. 5 the components with the same functions as on FIGS. 3 and 4 have the same references.

The device shown on FIG. 5 includes an analog switch 20, a sample and hold circuit 14', and an ADC 10 which in a first sequence has the same role as the ADC 15 in FIGS. 3 and 4 and in a second sequence that of the ADC 18. This is an "AD9048" manufactured by Analog Devices. The device also includes an arithmetic unit 70; this is a VLSI "IDT 7381" manufactured by Integral Device Technologies.

The device includes a memory block 50/60. This is separate access double port RAM "CYC 132" marketed by CYPRESS. This block is arranged as two sets of two blocks. A first block 50 includes two blocks, a block for LSB correction 52 and a block for MSB correction 51. A second block 60, used alternately with the other block 50, includes a block for LSB correction 62 and a block for MSB correction 61. The four blocks 51, 52, 61 and 62 have two consecutive memory addresses for each correction value, so as to have 16 bits per correction value. The device includes a DAC 40 (a "DAC 703" manufactured by Burn Brown) and a microprocessor 100.

The device includes an 8-bit DAC 16 (a "DAC08" manufactured by Analog Devices) and, finally, ten 3-state controlled latches 80 to 89, an operational amplifier 67 with two inputs 9 and 7 and one output 8, an analog switch 25 with two inputs 26 and 27 and one output 28. The circuit is clocked by the clock of the microprocessor 100, and a decoder sequencer circuit 30, an EPLD "EPM 5130" from Altera.

The operation of the circuit is as follows:

In measuring mode the analog input Xj is received on input 21 of a first controlled switch 20. The output 23 of this switch is applied to the sampler 14'. The output from the sampler is connected to the input 26 of a scale switch 25 and to the input 9 of the operational amplifier 67. The output 28 of the switch 25 is connected to the input of the ADC 10 which, during the first measuring sequence of the MSBs we shall call 15. The numeric output from the ADC 15 is fed via the latches 81 and 82, controllable by the sequencer 30, to the arithmetic and logic unit 70 which has registers enabling storage of the value received.

The numeric output 5 of the ADC 15 also addresses via a controllable latch 87 the high bits correction memory block 61. The value stored in the RAM addressed is sent to the arithmetic unit 70.

In the next sequence, for measuring the LSBs, the numeric output 5 from the ADC 15 is fed via the latch 87 to the input 2 of the DAC 16. The switch 25 is switched to its input 27 (shown by a hatched line). The output of the DAC 16 is received on the input 7 of the operational amplifier 67. The output 8 of the amplifier is connected to the input 27 of the switch 25 whose output 28 is connected to the input of the ADC 10 which during this second measuring sequence of the LSBs we shall call 18. The input 9,7 of the amplifier 67 represents the difference between the analog value $X_j$ and the MSBs of its converted value output by the ADC 15. The amplification value of the amplifier 67 corresponds to the scale factor between the high bits and the low bits. The difference amplified can be measured with the same ADC 10, and the conversion value will then represent the value of the LSBs. This value will address via the latch 87 the low bits correction memory block 62. This is made possible by the fact that the memory block addressed has been changed by a command 35 from the sequencer 30. The value will also be fed via the latch 81, controllable by the sequencer, to a different high bit input of the unit 70. The unit 70 also receives the value from the addresses storage location of the memory block 62.

When these 4 values are received, the arithmetic unit 70 calculates the algebraic total of the high bit value, the low bit value, and the high and low bit correction values; the output value 73 is the final conversion value.

The operation of the calibration circuit will now be explained.

For calibration, the switch 20 is switched to its contact 22. The sample and hold circuit 14' receives, via the output 23 of the switch 20, the value output by the DAC 40. First, the LSBS are corrected: for this calibration sequence the microprocessor 100 generates via the latch 88 the value 0 at the input 2 of the DAC 16.

The output value from the sampler 14' is applied to the input of the amplifier 67 whose output 8 is connected to the ADC 18 via the contacts 27 and 28 of the switch 25. The numeric value output by the ADC 18 is fed via the latch 86 to the microprocessor 100. This value is subtracted from value sent by this same microprocessor to the DAC 40 via the latches 80, 89. The exact analog values bracketing the exact switching value at the sensed numeric output of the ADC 18 are sought by successive testing, as explained earlier, and the lower value is written by the microprocessor 100 at the address corresponding to the numeric value in the low bits correction memory 50 of memory block 52.

When all the LSB numeric values of the ADC 18 have been executed, the calibration of the MSBs is carried out.

For this calibration the microprocessor 100 generates at the input of the DAC 16, via the latch 88, one of the values representing a possible numeric output from the ADC 15. The corresponding numeric value is placed on the DAC 40 via the latches 80, 89.

Thus the input 9 of the amplifier 67 receives the real value of the voltage coming from the DAC 40, the input 7 receives the value converted by the DAC 16 of the corresponding numeric value. The amplified difference is applied via the contacts 27 and 28 of the switch 25 to the ADC 18. The numeric value at the output of the ADC 18 addresses the low bits correction memory block 52, via the latch 87, and the microprocessor 100 via the latch 86. The microprocessor 100 also receives the value from the memory location in block 52 with the address equal to the numeric value placed on the input of the ADC 18.

The sum of these two values represents the correction value which is sent by the microprocessor 100 to an address in the high bits correction memory block 51 equal to the output value of the DAC 16.

As explained earlier, it is possible to refine this correction value by varying step by step the value generated at the input of the DAC 40 without changing the numeric value applied to the DAC 16. The number of steps necessary to cause a switching of the ADC 18 output to the next higher value represents the increase which must be applied to the correction initially calculated to obtain a refined correction value.

When the correction sequence for the MSBs is complete, the memory blocks 51/52 and 61/62, exchange their roles: block 50 is used for measurements and block 60 is used for calibration.

The inputs/outputs of the microprocessor 100 which is asynchronous with the sampler 14' are authorized by the sequencer decoder 30.

Although particular embodiments have been used to illustrate and describe the invention, the professional will recognize that many modifications are possible while remaining within the framework of the invention.

In particular, the means of conversion 10 may include p conversion stages, each stage handling a group of bits $M_1$, $M_2$ ... $M_p$ of decreasing significance, the groups each having $n_1, n_2 ... n_p$ bits and the groups overlapping by $n'_2$, $n'_3 ... n'_p$ bits, the stages being executed starting with the most significant bits and moving to the less significant bits, with means enabling subtraction of the value of the voltage already measured by the bits of the preceding group.

The stages can be implemented by stages in a cascade as represented for two stages in FIGS. 3 and 4, or by a single stage, the successive differences being corrected by a programmable operational amplifier or by several operational amplifiers.

The switching means to execute the stages successively in both cases are known to professionals of the art.

What is claimed is:

1. Process for conversion of an analog value X, which can range between limits $X_1$ and $X_2$, into a numeric value N ranging between limits $N_1$ and $N_{2^n}$ and comprising a sequence of bits, each bit having a weight depending on its position in the sequence, the values $N_1$ and $N_{2^n}$ corresponding to the values $X_1$ and $X_2$ and $2^n-1$ intermediate values $N_1$ between $N_1$ and $N_{2^n}$ each corresponding to an intermediate value Xi, the pth numeric value after $N_1$ corresponding to the value:

$$X_p = X_{1+p} \left( \frac{X_2 - X_1}{2^n} \right),$$

the process being implemented using a measuring circuit to which is input an instantaneous value $X_j$ of the analog value X and which outputs a corresponding numeric value $N_j$, the process being of the type in which a previous calibration is used to assign a correction value $h_j$ to each output numeric value $N_j$, wherein the calibration measurements are repeated throughout the conversion process without interrupting the conversion measurements, and wherein two distinct sets of correction values are created, a first and a second, the first created with the correction values $h_{j1}$ of a previous calibration and the second created with the correction values $h_{j2}$ of a current calibration, a current calibration being completed when all the correction values $h_{jr}$ that created the second set have been settled and wherein the first and second sets are swapped each time when a calibration is completed.

2. Process according to claim 1, wherein the calibration measurements are carried out periodically between two conversion measurements.

3. Process according to claim 1, wherein the calibration measurements are carried out on receipt of an external command.

4. Process according to claim 2, wherein the period between execution of calibration measurements is at least equal to the time required by a generator delivering a reference value for the calibration measurements to establish a stable reference value.

5. Process according to claim 3, wherein the calibration measurements are executed only on receipt of an external command and an internal authorization, this internal authorization being given only after the time required by a generator delivering a reference value for the calibration measurements to establish a new stable reference value from a previous reference value.

6. Process according to claim 4, wherein the bits constituting the output numeric value are organized into groups of consecutive bits, the bits of a first group being, with the exception of the last bit(s), of greater significance than those of the second group whose bits are in turn, with the exception of the last bit(s), of greater significance than those of the following groups, and wherein the measurement is made first by determining the value of the bits of the first group, the numeric value of this first group then being converted into an analog value which is subtracted from the input analog value, this calculated difference then serving to determine the value of the bits of the second group, and so on until the last group of bits, and wherein the correction value of the measurement is constituted from the sum of the partial correction values for each group of bits, these partial correction values being specific to each group and determined from the output value of each group of bits.

7. Process according to claim 4, wherein the bits constituting the output numeric value are organized into groups of consecutive bits, the bits of a first group being, with the exception of the last bit(s), of greater significance than those of the second group whose bits are in turn, with the exception of the last bit(s), of greater significance than those of the following groups, the last group containing the least significant bits, and wherein the calibration is made first by determining, for the last group of bits, the error on each possible output numeric value by comparison with a reference value, then determining for the next-to-last group the error on each possible output numeric value, the value being measured by the part of the measuring circuit giving the value of the bits of this group, the result of this measurement being corrected by the correction value applied to the output value obtained, and so on until the first group for which the error on each numeric output value is measured using the part of the measuring circuit giving the output value of the bits of the second group, the result of this measurement being corrected by the correction values applied to this output, this correction value being itself the sum of the correction value measured for this output by the part of the circuit used for measuring the possible values of the third group, which is corrected by the correction value applied to this numeric output value, and so on until the last group.

8. Calibration process according to claim 7, wherein each of the correction values applied to a numeric output value of a group is increased by the value by which the reference voltage must be increased in order to increase the numeric output value of the last group by one.

9. Device for conversion of an analog value X, which can range between limits $X_1$ and $X_2$, into a numeric value N ranging between limits $N_1$ and $N_{2^n}$, the values $N_1$ and $N_{2^n}$ comprising a succession of bits each bit having a weight depending on its position in the succession, the values N1 and $N_{2^n}$ corresponding to the values $X_1$ and $X_2$ and $2^n-1$ intermediate values $N_i$ between $N_1$ and $N_{2^n}$ each corresponding to an intermediate value $X_i$, a pth numeric value after $N_1$ corresponding to the value:

$$Xp = X_1 + p\left(\frac{X_2 - X_1}{2^n}\right),$$

the device including an analog-to-digital converter receiving an instantaneous input value $X_j$ and generating at its output a numeric value $N_j$, the device including a first block of memory locations, an adder receiving the value output by the converter and also the correction $h_j$ obtained from a memory location in the first block whose address is determined by the numeric order of magnitude $N_j$, a value $N_{jk}$ output by the device being equal to the sum of the values $N_j$ and $h_j$, wherein the device includes upstream of the converter a controlled analog switch with at least two positions, a measuring position and a calibration position, the switching from one position to the other being controlled by a sequencer, and when the switch is in measuring position, the converter receives the instantaneous value $X_j$ to convert and outputs the numeric value $N_j$ which is applied to the input of the adder, the other input of the adder receiving the value $h_j$ from the first memory block, the adder generating an output equal to $N_{jk}=N_j+h_j$, and when the switch is in calibration position the converter receives an instantaneous reference value $X_{jr}$ from a digital-to-analog converter and generates an output value $N_{jr}$ which is applied to the input of a microprocessor, this microprocessor updating the memory location having the address $N_{jr}$ in a second block of memory locations, the sequencer controlling the inversion of the first and second memory blocks once the calibration phase is complete, the second memory block then becoming the correction memory block and the first block becoming that receiving the calibration values.

10. Device for conversion of an analog value X, which can range between limits $X_1$ and $X_2$, into a n-bit numeric value N ranging between limits $N_1$ and $N_{2^n}$ in steps of $P_p$ equal to:

$$(x_2 x_1)/2^n,$$

the device including means of conversion handling a first group $M_1$ of $n_1$ bits, representing the most significant bits, the step $P_1$ of this first group being equal to:

$$(X_2-X_1)/2^{n_1},$$

a second group $M_2$ of $n_2$ bits, representing the bits of significance immediately inferior, the step $p_2$ of this second group being equal to:

$$(X_2-X_1)/2^{(n_1+n_2-n'_2)},$$

where $n'_2$ represents the number of the more significant bits whose weight is equal to that of the least significant bits of the first group, and so on until the last group $M_p$ representing the least significant bits whose step $p_p$ is equal to the measuring step of the device:

$$(X_2-X_1)/2^{(n_1+n_2+n_p-n'_2-n'_3-n'_p)},$$

the device including first means which receive the input value X at an instant where its instantaneous value is $X_j$, and convert the value $X_j$ into a numeric value $N_{j1}$ expressed by the bits of the first group, the device including, if p is greater than 1, first means of converting the numeric value $N_{j1}$ into an analog value $X_{j1}$, means of subtracting the analog values $X_j$ and $X_{j1}$, and means of converting the difference $X_j-X_{j1}$ into a numeric value $N_{j2}$ expressed by the bits of the second group, and means of converting the numeric value $N_{j2}$ into an analog value $X_{j2}$, means of calculating the difference $(X_j-X_{j1})-X_{j2}$, and means of converting this difference $(X_j-X_{j1})-X_{j2}$ into a numeric value $N_{j3}$ expressed by the bits of the third group, and so on until the means of converting the difference $(X_j-X_{j1}-X_{j2}-X_{jp}-1)-X_{jp}$ into a numeric value $N_p$ expressed by the bits of the last group, and, if p is greater than 1, means receiving the numeric values $N_{j1}$ to $N_{jp}$ and returning a numeric value $N_j$ which is the sum of the weights of each of the bits of each of the p groups of bits, wherein the device also includes a switch, means of control and calculation, two memory blocks for calibration and correction, means of controlling the switching of the switch, the switch having a first and second input and an output, the switch being controlled on each of its inputs by the means of control and calculation, on the first input the switch being connected to the means of conversion of the input value X, these means of control and calculation adding to the output value of the means of conversion all the p correction values stored in the storage locations of the first memory block, each correction coming from a sub-block assigned to a group of bits ($M_1, M_2 \ldots M_p$), the address of the storage location in the sub-block being determined by the output value of the group of bits, and on the second input the switch transmitting to the means of conversion a reference voltage provided by a voltage generator controlled by the means of control and calculation, these means of control and calculation being programmed to write in the storage locations of the second memory block a set of p correction values, each value being assigned to a sub-block of the calibration block and each sub-block receiving at the address equal to the numeric output value of one of the groups of bits ($M_1, M_2 \ldots M_p$) a value equal to the difference between the value represented by this numeric output value and the numeric value which would have been output had the measurement been exact, the means of switching inverting the roles of the calibration and correction memory blocks when it receives a command from the means of control and calculation.

11. Device according to claim 10, wherein the means of conversion employs two groups of bits, one group of more significant bits and one group of less significant bits.

12. Device for conversion of an analog value X, which can range between limited $X_1$ and $X_2$, into a numeric value N ranging between limits $N_1$ and $N_{2^n}$, the values $N_1$ and $N_{2^n}$ comprising a succession of bits each bit having a weight depending on its position in the succession, the values $N_1$ and $N_{2^n}$ corresponding to the values $X_1$ and $X_2$ and $2^n-1$ intermediate values $N_i$ between $N_1$ and $N_{2^n}$ each corresponding to an intermediate value $X_i$, a pth numeric value after $N_1$ corresponding to the value:

$$X_p = X_{1+p} \left( \frac{X_2 - X_1}{2^n} \right);$$

the device including an analog-to-digital converter receiving an instantaneous input value $X_j$ and generating at its output a numeric value $N_j$, the device including a first block of memory locations, an adder receiving the value output by the converter and also the correction $h_j$ obtained from a memory location in the first block whose address is determined by the numeric order of magnitude $N_j$, a value $N_{jk}$ output by the device being equal to the sum of the values $N_j$ and $h_j$, wherein the device includes upstream of the converter a controlled analog switch with at least two positions, a measuring position and a calibration position, the switching from one position to the other being controlled by a sequencer, and when the switch is in measuring position, the converter receives the instantaneous value $X_j$ to convert and outputs the numeric value $N_j$ which is applied to the input of the adder, the other input of the adder receiving the value $h_j$ from the first memory block, the adder generating an output equal to $N_{jk}=N_j+h_j$, and when the switch is in calibration position the converter receives an instantaneous reference value $X_{jr}$ from a digital-to-analog converter and generates an output value $N_{jr}$ which is applied to the input of a microprocessor, this microprocessor updating the memory location having the address $N_{jr}$ in a second block of memory locations, the sequencer controlling the inversion of the first and second memory blocks once the calibration phase is complete, the second memory block then becoming the correction memory block and the first block becoming that receiving the calibration values;

wherein the means of conversion includes a sample and hold circuit, an analog-to-digital converter for the most significant bits, an analog-to-digital converter for the least significant bits, a digital-to-analog converter and a subtractor, the sample and hold circuit receiving an input voltage of the means of conversion and feeding the high bit converter and an input of the substractor, a second input of the subtractor being fed by the digital-to-analog converter receiving the numeric output of the high bit converter, one output of the subtractor feeding the low bit analog-to-digital converter.

13. Device according to claim 11, wherein the means of conversion includes a sample and hold circuit, a scale switch controllable by the means of control and calculation, the switch having two inputs, a first and a second, and one output, an analog-to-digital converter, a digital-to-analog converter and an operational amplifier, the sample and hold circuit being connected to the first input of the switch and to an input of the operational amplifier, a second input of this operational amplifier receiving the voltage output by the digital-to-analog converter which is the conversion of the numerical value on its input received from the output of the analog-to-digital converter which itself receives as input the voltage from the sampler when the scale switch is positioned on its first input, or the output voltage of the amplifier when the scale switch is positioned on its second input.

* * * * *